United States Patent [19]
O'Keeffe et al.

[11] 3,867,148
[45] Feb. 18, 1975

[54] MAKING OF MICRO-MINIATURE ELECTRONIC COMPONENTS BY SELECTIVE OXIDATION

[75] Inventors: Terence W. O'Keeffe, Pittsburgh; Alan J. Simon, Trafford, both of Pa.

[73] Assignee: Westinghouse Electric Corporation, Pittsburgh, Pa.

[22] Filed: Jan. 8, 1974

[21] Appl. No.: 431,656

[52] U.S. Cl. .................................... 96/36.2, 156/11
[51] Int. Cl. ........................... C23f 1/02, G03c 5/00
[58] Field of Search ................. 96/36.2; 156/11, 17; 117/212; 29/625; 174/68.5; 317/235

[56] References Cited
UNITED STATES PATENTS
3,799,777 3/1974 O'Keefe et al. ...................... 96/36.2

*Primary Examiner*—William A. Powell
*Attorney, Agent, or Firm*—C. L. Menzemer

[57] ABSTRACT

A micro-miniature electronic component and particularly an electromask of high resolution is made by first applying a metal layer, of a composition, such as titanium, capable of being etched by an etchant at a relatively high rate and capable of becoming relatively etchant resistant on oxidation, over a major surface of a substrate. A desired component pattern is then defined, preferably by selective exposure with an electron beam, in a resist layer directly overlaid on the metal layer by difference in solubility between exposed and unexposed portions of the resist. The desired component pattern is then transferred to the metal layer by (i) removing less soluble portions of the resist layer to expose first portions of the metal layer, (ii) applying over said exposed first portions and the remaining portions of resist layer an oxidation masking layer of a composition such as aluminum, being relatively oxidation resistant compared to the metal layer and being relatively etchable compared to the metal layer when oxidized, (iii) removing the remaining portions of the resist layer and overlying oxidation masking layer to expose second portions of the metal layer, (iv) selectively oxidizing the second portions of the metal layer to become relatively etchant resistant while said first portions of the metal layer are masked against oxidation by the masking layer, and (v) removing the remaining portions of the oxidation masking layer and underlying unoxidized first portions of the metal layer by etching.

5 Claims, 6 Drawing Figures

MAKING OF MICRO-MINIATURE ELECTRONIC COMPONENTS BY SELECTIVE OXIDATION

FIELD OF THE INVENTION

This invention relates to making of semiconductive devices, integrated circuits and other micro-miniature electronic devices by processing a component layer or body through openings or windows in a radiation sensitive or resist layer of a defined planar pattern.

BACKGROUND OF THE INVENTION

The production of a micro-miniature electronic component requires the formation of one or more very accurately dimensioned component patterns in layers on a substrate or in a semiconductor body. The standard production method is to selectively expose portions of the resist layer overlaid on a component layer or body to define in the resist layer a pattern by differential solubility between exposed and unexposed portions of the resist layer. The resist layer is then developed to remove the less soluble portions of the resist layer and leave remaining the resist layer in the positive or negative of the desired component pattern. The component layer or body is then processed through the openings or window pattern in the resist layer by etching, diffusing, implanting or deposition.

One of the problems in such formation technique is that the defined pattern in the resist layer must be transferred to the component layer with high resolution to obtain highly accurate micro-miniature components. In some situations, this transfer cannot be done by standard etching techniques. The etching proceeds at such a high rate that the sensitive layer is undercut and the transfer cannot be reliably controlled.

This problem is particularly acute in making micro-miniature devices of micron size dimensions. Accuracies in the submicron range are required. Such micro-miniature devices cannot be made by standard photolithographic techniques because the desired resolution cannot be achieved with photon radiation. The electron image projection system is provided for the production of planar component patterns of high resolution for micro-miniature devices. The system is described in U.S. Pat. Nos. 3,679,497 and 3,710,101, granted July 25, 1972 and Jan. 9, 1973, respectively, and both assigned to the same assignee as the present application. The problem is that the resolution of the projection system cannot be any better than the resolution of the pattern on the electromasks.

The "electromasks" designates the pattern-bearing photocathode of the electron image projection system. The electromask is analogous to the "photomask" applied to a typically glass or quartz plate and contains the component pattern or its negative for use in the well-known photolithographic techniques for making substantially planar electronic devices. The electromask usually contains the device patterns at full scale which are repeated in a radiation opaque layer over the surface of the radiation transparent, preferably quartz substrate. The photocathode material is typically the thin film (e.g. 40 Angs.) of palladium overlaying the entire work area of the electromask. See, e.g. U.S. Pat. Nos. 3,585,433, 3,588,570, 3,686,028 and 3,672,987.

The difficulty is that the most useful material known for use in making the opaque layer of the photocathode is titanium dioxide. A thin film, i.e. 100–600 Angs., is sufficient to block approximately 99 percent of the ultraviolet radiation of interest, i.e. radiation shorter in wavelength than 2600 Angs. Further, such titanium dioxide layers are hard, stable, etchant resistant and extremely adherent to quartz which is typically used for the substrate.

Use of an opaque layer of titanium dioxide, however, requires first formation and etching of a titanium layer; and chemical etching of thin titanium layers are extremely unreliable. A pattern in a resist layer produced by an electron beam of a scanning electron microscope cannot, therefore, be directly transferred to a titanium layer with the requisite degree of precision by chemical etching. The etchant rapidly attacks the titanium and undercuts the resist layer so that the pattern in the resist layer cannot be accurately transferred by etching to a pattern in a titanium layer. Sputter etching and ion beam etching techniques have been found to provide high resolution in the transfer of the component pattern to the titanium layer. However, these techniques present problems in controlling etching rates, maintaining the integrity of the unexposed radiation sensitive layer, and/or subsequent removal of the underradiated sensitive layer.

The present invention overcomes these difficulties and problems. It provides a simple way of making a very accurate micro-miniature electronic component using titanium layers and the like by employing a selective oxidation method.

SUMMARY OF THE INVENTION

A method is provided for making micro-miniature electronic components and particularly electromasks. A metal layer of a composition, such as titanium, capable of being etched by a given etchant at a relatively high rate and capable of becoming relatively etchant resistant to a given etchant on oxidation is applied typically by standard vapor or sputter deposition over a major surface of a suitable substrate.

A resist layer sensitive at least to radiation selected from the group consisting of photons and electrons is then applied over the metal layer. A desired component pattern (or the negative thereof) is then defined in the resist layer typically by movement of electron of finedimension through a matrix on command from a digital computer. Alternatively, a standard photolithographic technique or the electron image projection system (see U.S. Pat. No. 3,679,497) may be used to define the desired component pattern in the resist layer. In any case, the exposure to the radiation makes the resist layer selectively either more or less soluble in a given solvent so that the desired component pattern is defined by the difference in solubility between the exposed and unexposed portions of the resist layer.

The more soluble portions of the resist layer are then removed by a suitable solvent to expose first portions of the metal layer. The desired component layer is thus defined by the remaining portions of the resist layer and the exposed first portions of the metal layer. Thereafter, an oxidation masking layer is applied over the remaining portions of the resist layer and the exposed first portions of the metal layer to a thickness less than about 80% of the thickness of the resist layer by a standard vapor or sputter deposition technique. The oxidation masking layer is of a material capable of being relatively oxidation resistant compared to the metal layer and being relatively etchable compared with the metal layer composition when oxidized.

The remaining portions of the resist layer and the overlying oxidation masking layer, such as aluminum, is then removed to expose second portions of the metal layer defining the desired component pattern. This step is accomplished by dissolving the remaining resist in a suitable solvent and simultaneously rejecting the overlying oxidation masking layer.

Exposed second portions of the metal layer are then selectively oxidized to form a relatively etchant resistant portion in the metal layer defining the desired component pattern. First portions of the metal layer are masked from oxidation during this step by the overlying oxidation masking layer. Thereafter, the desired component pattern is defined in the metal layer by removing the oxidation masking layer and underlying unoxidized metal layer typically by a suitable etchant.

Other manufacturing steps are then performed to complete the desired electronic device, including repeating the above steps one or more times to form additional desired component patterns of the device. For an electromask, the device can be completed simply by applying a photocathode layer over the remaning portions of the metal layer and the exposed portions of a major surface of the substrate.

Other details, objections and avantages of the invention will become apparent as the following description of the present preferred embodiment thereof and present preferred method of practicing the same proceeds.

BRIEF DESCRIPTION OF THE DRAWINGS

In the accompanying drawings, the present preferred embodiment of the inventon and the present preferred method of practicing the invention is illustrated in which.

DESCRIPTION OF THE PREFERRED EMBODIMENT

Figure 1:
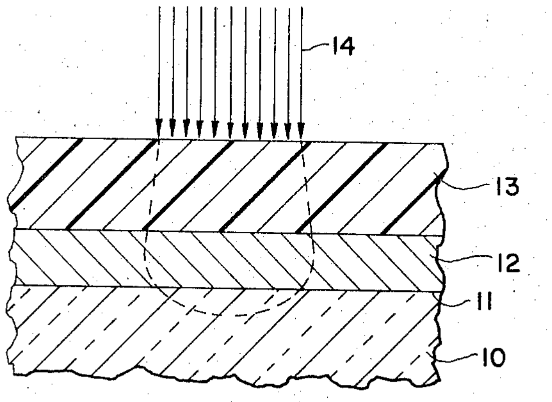
FIGS. 1 through 5 are fragmentary crosssectional views in elevation of a micro-miniature electronic component such as an electromask at various stages in manufacture in accordance with the present invention.

Referring to FIG. 1, substrate 10 such as sapphire quartz, glass, or a semiconductor body is provided for a desired semiconductor device or other microminiature electronic component. For an electromask, the substrate is a material substantially transparent to ultraviolet radiation such as quartz.

Substrate 10 has a major surface 11 of planar configuration on which a suitable metal layer 12 is applied by standard vapor or sputter deposition techniques. Metal layer 12 is of a composition capable of being etched at a relatively high rate by a given etchant and capable of oxidation to become substantially etchant resistant to a given etchant. For an electromask, layer 12 is preferably a thin layer of titanium desirably 100 to 600 Angstroms in thickness and most desirably about 400 Angstroms in thickness. Such a thin layer, when connected to $TiO_2$ is sufficient to block approximately 99 percent of the ultraviolet radiation of interest, i.e. radiation having a wavelength shorter than 2600 Angs. Thinness is important to attaining a high resolution in the pattern formed in the metal layer and to maintain continuity of the subsequently overlaid layer of palladium or other photocathodic material.

Further, titanium dioxide is hard, stable, etchant resistant and extremely adherent to quartz, which is typically used for the electromask substrate. These properties are essential to the continued life of the electromask. It is well known that photocathodic materials lose their photoemissive properties after some use. Thus, to maintain the electromask, the photocathodic material must be periodically removed and a new layer of photocathodic material applied. By having the opaque or blocking metal layer of titanium dioxide, a component pattern can be permanently affixed to the quartz substrate and the life of the electromask extended almost indefinitely. This advantage is extremely valuable since the pattern definition step in the metal layer as hereinafter defined is typically the most expensive part of the fabrication of the electromask.

Still referring to FIG. 1, a suitable resist layer 13 is applied over metal layer 12. For selective exposure by an electron beam 14, the material of layer 13 is sensitive to electron radiation to define in the layer a desired component pattern by differential solubility. That is, the exposed portion of the layer is made either more or less soluble to certain solvents than the nonirradiated portions of the layer so that the component pattern is defined by difference in solubility between the exposed an unexposed portions of the resist layer. Preferably, an electron resist layer is light insensitive, and is relatively stable and has a relatively long shelf life. Examples of negative resist are polystyrene, polyacrylamide, polyvinyl chloride and certain selected hydrocarbon silicones. Examples of positive resists are polyisobutylene and polymethylmethacrylates and poly(alphamethylstyrene).

A good positive resist is polymethylmethacrylate of an average molecular weight of over 100,000 containing a very small fraction of polymer having molecular weight of 50,000 or less to avoid pinholes during processing. Polymethylmethacrylates are rendered readily soluble in either 95 percent ethanol (balance 5 percent water), or in a mixture of 30% by weight of methylethyl ketone and 70 percent isopropanol when subjected to an electron beam of 10 kilovolts to supply $5 \times 10^{-5}$ coulombs per $cm^2$. The portions so exposed are soluble in the previously mentioned solvent, whereas the remainder of the resist coating is not as soluble in such solvent.

Polyacrylamide is a good negative resist inasmuch as the electron beam at 10 kilovolts applying $3 \times 10^{-6}$ coulombs per $cm^2$ will render it slowly soluble in dionized water, while the remainder of the coating will resist concentrated phosphoric acid. This electroresist is not removed by organic solvents such as methanol. It forms an excellent mask for a sputtering-etch treatment. The average molecular weight of a good polyacrylamide resist that has given good results is $4.5 \times 10^7$.

The resist layer sensitive to electron radiation may also be provided by any of the various commercially available "photoresists" materials that are sensitive to electron bombardment to become more soluble or insoluble in a specified solvent. Three such photoresists are AZ-1350 and AZ-1350H made by Shipley and Microline PR-102 made by GAF.

The resist may also be one of the various inorganic compounds as well as organic compounds. For example, silicon dioxide or silicon nitride ($Si_3N_4$) layers on a substrate when subjected to an electron beam are rendered more soluble in an etchant. Buffered hydrofluoric acid will dissolve more readily portions of a silicon dioxide layer which have been exposed to an electron beam, as compared to the portions of the layer not exposed to the electron beam. This characteristic is known as the "BEER" effect (i.e. Bombardment Enhanced Etch Rate). Etch enhancement ratios of about 3 are obtained, so that the electron exposed portions will be completely etched away while there will be only as little as a third of the unexposed portions of layer that will be etched away.

In any case, the thickness of the resist layer 13 is also important to the resolution of the pattern defined in it. The thickness of the resist layer 13 must be on the order of the resolution desired in the pattern. Typically, the thickness will be between about 0.2 and 1.0 micron. If the desired resolution is 0.1 micron, then the resist layer need be on the order of 0.5 micron or less.

Figure 2:
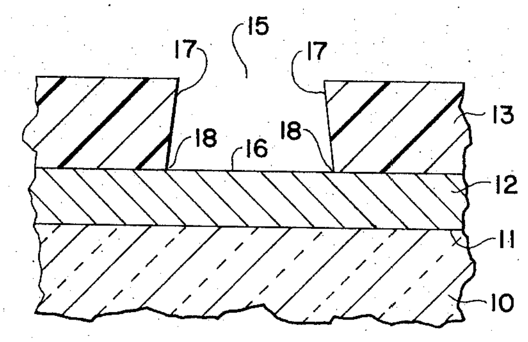

The resist layer 13 is selectively exposed by a single electron beam 14 of fine dimensions of a scanning electron microscope. The position of the beam 14 is sequentially moved on demand from a digital computer over the resist layer to expose and define the desired component pattern in the resist layer. The path of the beam is recorded in the radiation sensitive or resist layer by a differential in solubility between the exposed and unexposed portions. In a positive electron resist layer, it should also be noted that the electron beam disperses as it enters the resist layer. The dispersion causes the edge of the positive electron resist layer to have a reentrant or overhang profile (as shown in FIG. 2) after it is developed. Although not limiting, this overhang profile can aid in achieving high resolution by the present invention.

It should be noted that the selective exposure step can be alternatively performed with the electron image projection system described in U.S. Pat. No. 3,679,497 and assigned to the same assignee as the present application, or by a standard photolithographic technique. Also, a photon beam of fine-dimension can alternatively be used in place of the electron beam. In these latter alternatives, a standard photoresist is used in place of a resist that is electron sensitive. These latter alternatives are not, however, preferred in performing the present invention because the photon radiation does not provide as high of resolution as the electron beam.

Referring to FIG. 2, the more soluble portions of resist layer 13 are then removed by a solvent or "developer" to form in layer 13 window pattern 15, expose first portion 16 of metal layer 12, and leave remaining portions of layer 13 to define the desired component pattern for the micro-miniature electronic device. A solvent suitable for such use will vary with the composition of the resist layer 13. Some suitable solvents for the acrylate and methacrylate materials are alcohols, ketones and mixtures thereof. With the electron exposed resist layer, the edge portions 17 of the remaining layer 13 at the window pattern 14 have a reentrant or overhang profile so that bases 18 of the edge portions 17 are protected and do not intimately contact subsequently deposited metal layers. As a result, high resolution is assured by the selective oxidation technique as hereinafter explained.

Figure 3:
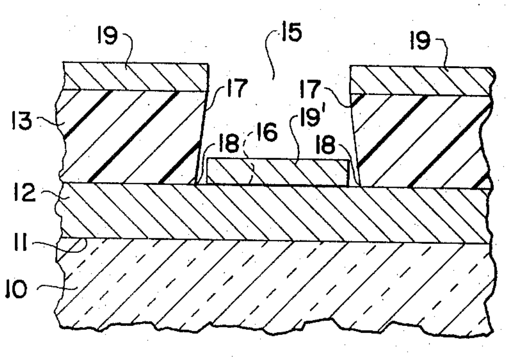
Figure 3A:
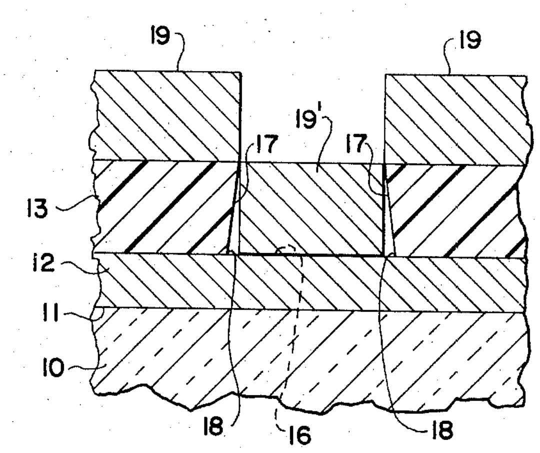

Referring to FIGS. 3 and 3A, oxidation masking layers 19 and 19' are simultaneously deposited by a standard vapor or sputtering technique over the entire major surface 11 of the substrate 10. Layer 19 is deposited on remaining portions of resist layer 13, and layer 19' is deposited on exposed first portions 16. Because of the overhang of edge portion 17 of the resist layer at the window pattern 15, layer 19' is not in initmate contact with resist layer 13. Any material may be appropriate for deposition as layer 19—19' which is relatively oxidation resistant compared with metal layer 12 and which is readily etchable with an etchant to which oxidized portions of metal layer 12 is relatively etchant resistant. Typically, such a material will be of a Group IB, IIIB, VIB, VIA or VIII metal such as silver, nickel, palladium, or tungsten. Preferably, however, aluminum, gold or platinum is used for layers 19—19' because of the deposition uniformity and subsequent relative etchability.

The thickness of layers 19—19' must be controlled to enable the subsequent rejection step to be performed. The thickness of the layers 19—19' cannot exceed the thickness of resist layer 13. FIG. 3 shows the deposition to be of proper thickness, while FIG. 3A illustrates what happens if the layers 19—19' are too thick. As FIG. 3A shows, edge portions 17 in resist layer 13 at window pattern 15 are buried so that the resist material cannot be dissolved without also dissolving or etching the oxidation masking layer 19—19'. For efficient removal of the remaining resist layer and good rejection of overlying layer 19, the thickness of layers 19—19' should be less than 80 percent of the thickness of resist layer 13. Typically, oxidation masking layer 19—19' is about 1,000 to 2,000 Angs. in thickness.

Figure 4:
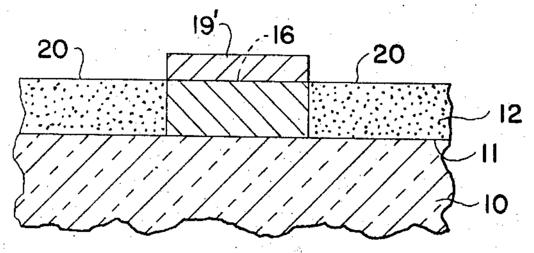

Referring to FIG. 4, layer 19 is rejected along with the removal of the underlying resist layer 13. The resist material is dissolved by a suitable solvent such as trichloroethylene or ketone. Preferably, this step is performed with a prolonged soak in the solvent. Also, ultrasonic agitation and/or like brushing with a soft brush is often beneficial in performing this step.

Thereafter, the second portions 20 of metal layer 12 are selectively oxidized to form an etchant resistant portion in metal layer 12, while first portions 16 of metal layer 12 are masked against oxidation by oxidation masking layer 19'. If layer 12 is titanium of a thickness of about 400 Angs. or less, portions 20 can be fully oxidized by heating in an oxygen-rich atmosphere at 400°C for about three hours. If the titanium layer is thicker, a longer heating will be required for oxidation. At 400°C little oxidation of an aluminum masking layer occurs during the time required to complete oxidation of the titanium.

Figure 5:
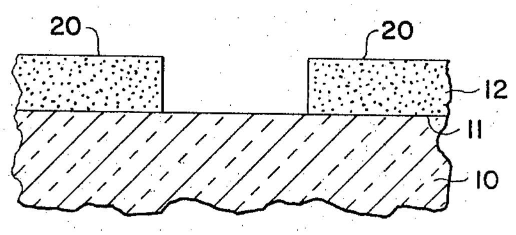

Referring to FIG. 5, the desired component pattern for the micro-miniature electronic device is defined by oxidized portions 20 of metal layer 12. This step is accomplished by etching away oxidation masking layer 19' and the underlying first portions 16 of metal layer 12. An etchant suitable for this step will vary with the composition of layers 12 and 19', as well as the composition of substrate 10. For metal layer 12 of titanium, layer 19' of aluminum, and substrate 10 of quartz, a typical recipe for the etchant is a 10 percent aqueous solution of sodium hydroxide. The 10 percent sodium hydroxide solution will etch the titanium dioxide portions 20 of layer 12 but not at a significant rate. Typically, this etching step is performed by immersion in the hydroxide solution for about one minute.

After formation of the desired component pattern in the metal layer by use of the selective oxidation technique as hereinbefore described, other manufacturing steps are performed in the making of the micro-miniature device, including repeating the steps above described one or more times. For example, to make an electromask, a photocathode layer of, for example, palladium, gold, platinum, aluminum, barium, copper or cesium iodide will be formed over the entire workpiece by standard vapor or sputter deposition techniques to complete the device.

While the present preferred embodiment of the invention and method of performing it has been specifically described, it is distinctly understood that the invention may be otherwise variously embodied and used within the scope of the following claims.

What is claimed is:

1. A method of making a micro-miniature electronic component comprising the steps of:

A. forming on a major surface of a substrate a layer of metal capable of being etched at a relatively high rate by an etchant and capable of becoming relatively etchant resistant to an etchant on oxidation;

B. applying over the metal layer a resist layer sensitive at least to one type of radiation selected from the group consisting of photons and electrons;

C. defining a desired component pattern in the resist layer by selectively exposing portions of the resist layer to a radiation to which the layer is sensitive to define the component pattern by difference in solubility between the exposed and unexposed portions of the layer;

D. removing the more soluble portions of the resist layer to expose first portions of the metal layer and to leave remaining portions of the resist layer defining the desired component pattern;

E. applying over the exposed first portions of the metal layer and the remaining portions of the resist layer an oxidation masking layer of a thickness less than about 80 percent of the rersist layer thickness, said masking layer being relatively oxidation resistant compared to the metal layer and being relatively etchable compared to the metal layer when oxidized;

F. removing the remaining portions of the resist layer and oxidation masking layer thereover to expose second portions of the metal layer defining the desired component pattern;

G. selectively oxidizing the exposed second portions of the metal layer to form a relatively etchant resistant portion in the metal layer corresponding to the second portions, while the first portions of the metal layer are masked against oxidation by the masking layer; and H. removing remaining portions of the oxidation masking layer and the underlying unoxidized first portions of the metal layer with an etchant to which the oxidized portions of the metal layer are resistant to leave the oxidized second portions of the metal layer in the desired component pattern defined originally in the resist layer.

2. A method of making a micro-miniature electronic component as set forth in claim 1 wherein:

the metal layer is titanium.

3. A method of making a micro-miniature electronic component as set forth in claim 2 wherein:

the oxidation masking layer is aluminum.

4. A method of making an electromask comprising the steps of:

A. forming on a major surface of a quartz substrate a titanium layer;

B. applying over the titanium layer an electron resist layer;

C. defining in the electron resist layer a desired component pattern by selectively exposing portions of the resist layer to electron radiation to define the component pattern by difference in solubility between the exposed and unexposed portions of the layer;

D. removing the more soluble portions of the electron resist layer to expose first portions of the titanium layer and leave remaining portions of the resist layer defining the desired component pattern;

E. applying over the exposed first portions of the titanium layer and the remaining portions of the resist layer an oxidation masking layer;

F. removing the remaining resist layer and oxidation masking layer thereover to expose second portions of the titanium layer defining the desired component pattern;

G. selectively oxidizing the exposed second portions of the titanium layer to form a relatively etchant resistant titanium dioxide portion in the titanium layer corresponding to the second portions, while the first portions of the titanium layer are masked against oxidation by the masking layer; and H. removing the remaining portions of the oxidation masking layer and the underlying first portions of the titanium layer with an etchant to which the titanium dioxide portions of the titanium layer are resistant to leave the oxidized second portions of the titanium layer in the desired component pattern defined originally in the resist layer.

5. A method of making an electromask as set forth in claim 4 wherein:

the oxidation masking layer is aluminum.

* * * * *